(12) United States Patent
Singh et al.

(10) Patent No.: US 8,198,727 B1
(45) Date of Patent: Jun. 12, 2012

(54) INTEGRATED CIRCUIT/SUBSTRATE INTERCONNECT SYSTEM AND METHOD OF MANUFACTURE

(75) Inventors: Inderjit Singh, Saratoga, CA (US); Ray Chen, Fremont, CA (US); Orion K. Starr, San Jose, CA (US); Behdad Jafari, Saratoga, CA (US)

(73) Assignee: NVIDIA Corporation, Santa Clara, CA (US)

( * ) Notice: Subject to any disclaimer, the term of this patent is extended or adjusted under 35 U.S.C. 154(b) by 830 days.

(21) Appl. No.: 11/611,818

(22) Filed: Dec. 15, 2006

(51) Int. Cl.
*H01L 23/48* (2006.01)

(52) U.S. Cl. ........ 257/737; 257/772; 257/738; 257/779; 257/780; 257/E23.023

(58) Field of Classification Search .................. 257/772, 257/779, 738, 780, 781, 737, E23.023
See application file for complete search history.

(56) References Cited

U.S. PATENT DOCUMENTS

| 6,409,073 | B1* | 6/2002 | Kaskoun et al. | 228/180.22 |
| 7,078,822 | B2 | 7/2006 | Dias et al. | 257/786 |
| 2002/0070451 | A1* | 6/2002 | Burnette et al. | 257/737 |
| 2002/0084483 | A1* | 7/2002 | Rudeck | 257/315 |
| 2003/0234277 | A1* | 12/2003 | Dias et al. | 228/180.22 |
| 2007/0212820 | A1* | 9/2007 | Choudhary et al. | 438/118 |

FOREIGN PATENT DOCUMENTS

JP 03273650 * 12/1991

* cited by examiner

*Primary Examiner* — Marcos D. Pizarro
*Assistant Examiner* — Eva Yan Montalvo
(74) *Attorney, Agent, or Firm* — Zilka-Kotab, PC

(57) ABSTRACT

An integrated circuit/substrate interconnect apparatus and method are provided. Included is an integrated circuit including a plurality of bond pads, and a substrate including a plurality of landing pads and a mask. Such mask is spaced from the landing pads for defining areas therebetween. Further provided is a plurality of interconnects connected between the bond pads of the integrated circuit and the landing pads of the substrate. The interconnects include metal projections extending from the bond pads and a solder material for connecting the metal projections and the landing pads of the substrate.

21 Claims, 6 Drawing Sheets

INTEGRATED CIRCUIT/SUBSTRATE INTERCONNECT SYSTEM AND METHOD OF MANUFACTURE

FIELD OF THE INVENTION

The present invention relates to interconnects used to attach an integrated circuit to a carrier substrate, and more particularly to interconnects between such carrier substrate and projections extending from the integrated circuit.

BACKGROUND

FIG. 1 illustrates a prior art assembly 100 including an integrated circuit 102 (illustrated as a "flip chip") with an active surface 104 that is physically and electrically attached to a connection surface 106 of a carrier substrate 108 by a plurality of interconnects 112. Such interconnects 112 extend between bond pads 114 on the active surface 104 of the integrated circuit 102 and landing pads 116 on the connection surface 106 of the carrier substrate 108. Finally, an underfill material 118 may be disposed between the active surface 104 of the integrated circuit 102 and the connection surface 106 of the carrier substrate 108 to prevent contamination and to increase mechanical reliability.

In the past, such interconnects 112 comprised solely of solder material. However, recent designs have replaced such solder material, at least in part, with projections to improve bump pitch (e.g. the center-to-center distance between interconnects 112, etc.). More information regarding such interconnects 112 will be set forth during the description of FIG. 2.

FIG. 2 illustrates a single interconnect 112 including a metal projection 201, in accordance with the prior art. Such metal projection 201 may take various forms, such as a copper column, and may be formed on the bond pad 114 of the integrated circuit 102. The metal projection 201 is used for achieving a sufficient current flow through each interconnect 112 and to further reduce bump pitch, as mentioned earlier. As shown, the interconnect 112 still employs some solder material 202 to attach the metal projection 201 to the corresponding landing pad 116 of the carrier substrate 108.

As is known in the art, a photoresist mask 204 is typically patterned to contain the solder material 202, prior to the attachment of the metal projection 201 to the corresponding landing pad 116. Despite such containment, the solder material 202 still protrudes in the manner shown (see item 206), thus augmenting the aforementioned bump pitch in an undesirable manner.

SUMMARY

An integrated circuit/substrate interconnect apparatus and method are provided. Included is an integrated circuit including a plurality of bond pads, and a substrate including a plurality of landing pads and a mask. Such mask is spaced from the landing pads for defining areas therebetween. Further provided is a plurality of interconnects connected between the bond pads of the integrated circuit and the landing pads of the substrate. The interconnects include metal projections extending from the bond pads and a solder material for connecting the metal projections and the landing pads of the substrate. In some optional embodiments, the solder material may be plated, lead-free, etc.

DETAILED DESCRIPTION

Figure 1:
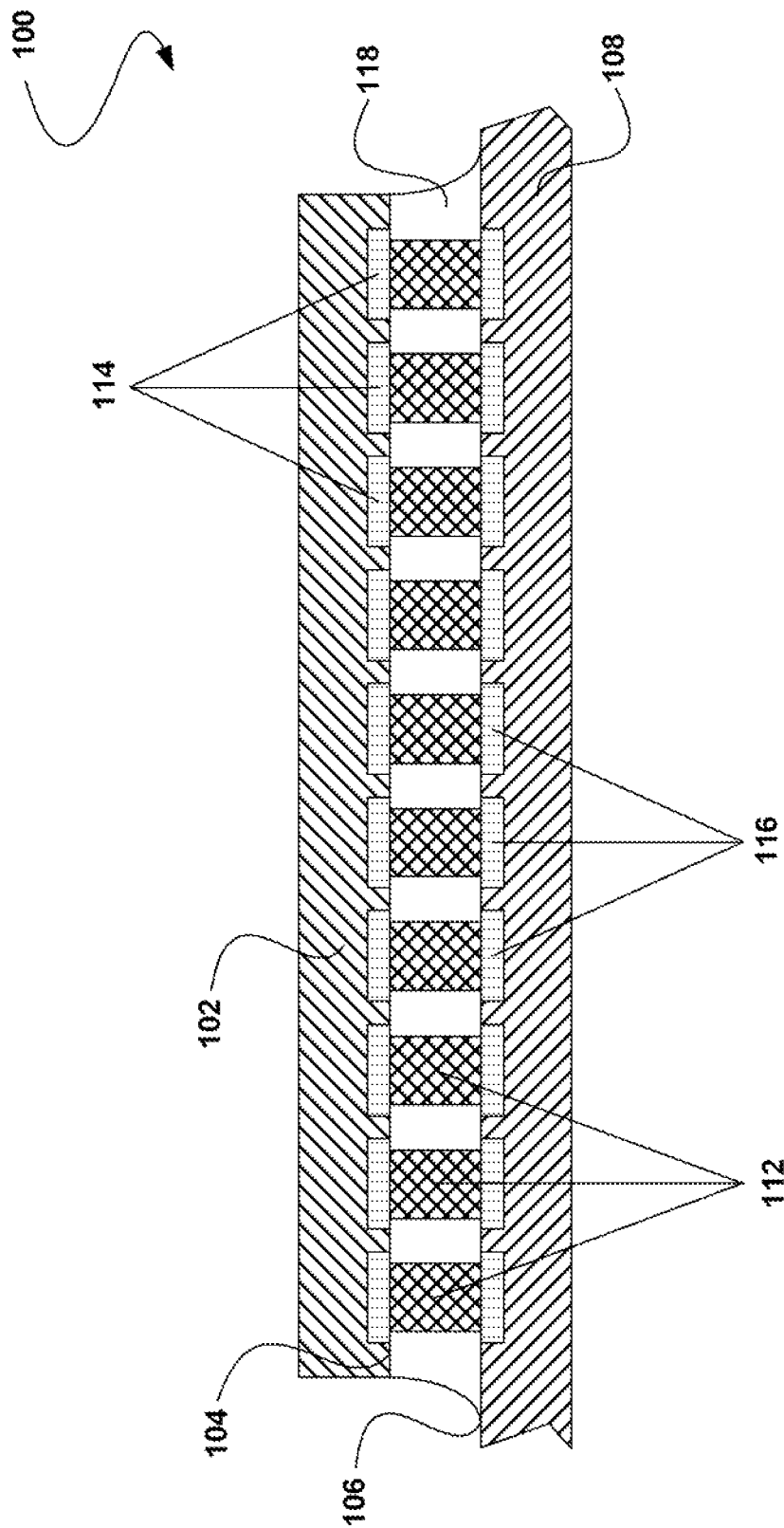
FIG. 1 illustrates a prior art assembly including an integrated circuit with an active surface that is physically and electrically attached to a connection surface of a carrier substrate by a plurality of interconnects.
Figure 2:
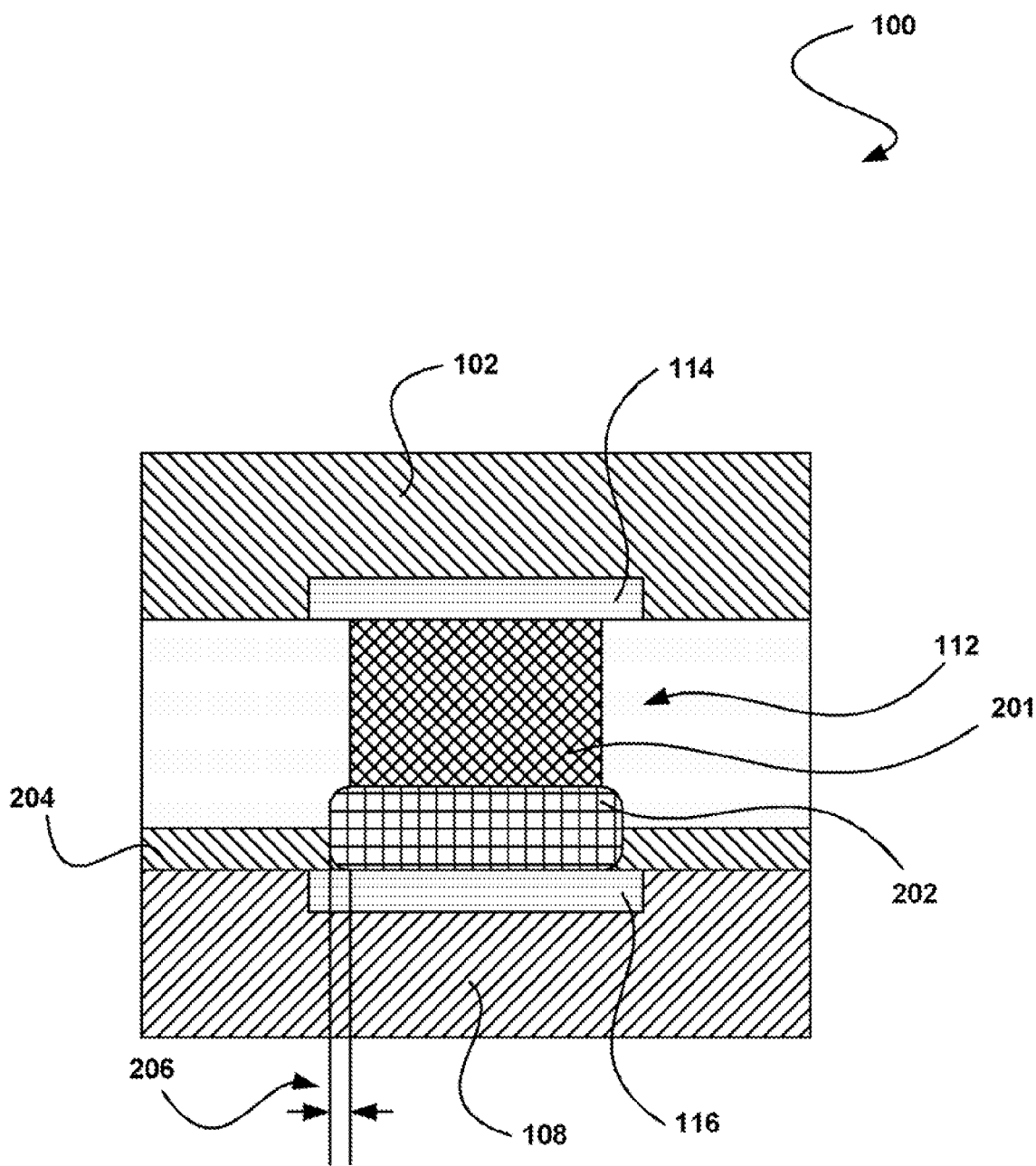
FIG. 2 illustrates a single interconnect including a metal projection, in accordance with the prior art.
Figure 3:
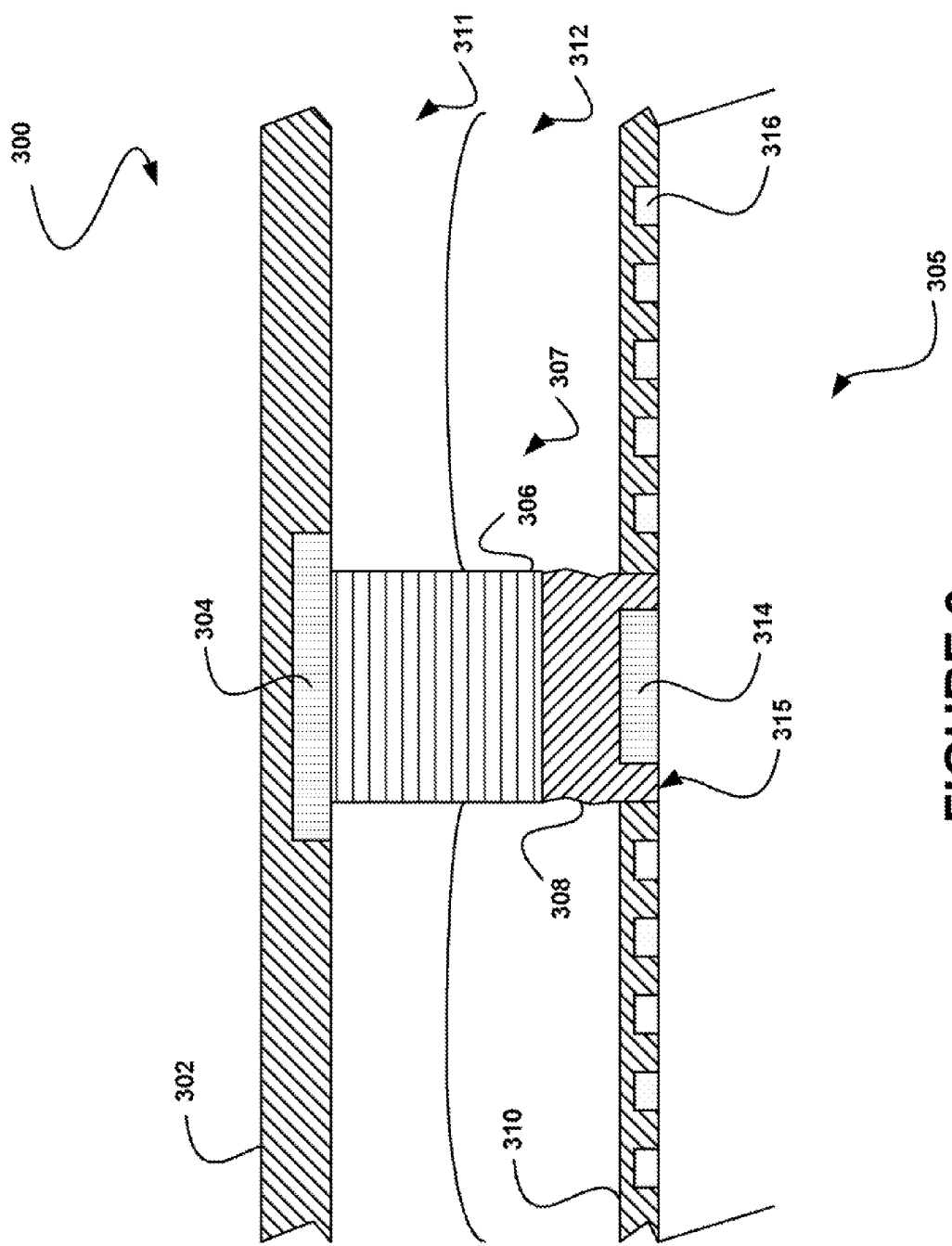
FIG. 3 shows an apparatus for interconnecting an integrated circuit and a substrate, in accordance with one embodiment.

FIG. 3 shows an apparatus 300 for interconnecting an integrated circuit 302 and a substrate 305, in accordance with one embodiment. In various embodiments, such integrated circuit 302 may take the form of a processor [e.g. a central processing unit (CPU), etc.], a graphics processor, one or more chips in a chipset (e.g. a group of integrated circuits designed to work and/or sold as a unit for performing related functions, etc.), etc. Of course, in the context of the present description, such integrated circuit 302 may refer to any circuit that is integrated utilized any desired processing (e.g. semiconductor processing, etc.).

As further shown, the integrated circuit 302 further includes a plurality of bond pads 304 (while only one bond pad is shown for purposes of clarity, many exist). Of course, such bond pads 304 may comprise of any desired material and serve to provide an interface with any circuitry, input/output (I/O) routing, etc. of the integrated circuit 302, in a manner that will soon be set forth.

The substrate 305 is illustrated to include a plurality of landing pads 314 (while only one landing pad is shown for purposes of clarity, many exist). In various embodiments, the substrate 305 may include a multi-layer organic substrate, a built-up substrate, etc. In the context of the present description, however, the substrate 305 may include any entity to which the integrated circuit 302 may be attached. Similarly, while the landing pads 314 may take various forms [e.g. bare on lead (BOL)], etc.; such landing pads 314 may take any desired form for providing an interface with respect to the substrate 305.

With continuing reference to FIG. 3, a mask 310 is shown to be formed on the substrate 305. Further, such mask 310 is spaced from the landing pads 314 for defining areas 315 therebetween, for reasons that will soon become apparent.

Further provided is a plurality of interconnects 307 (while only one interconnect is shown for purposes of clarity, many exist). Such interconnects 307 are connected between the bond pads 304 of the integrated circuit 302 and the landing pads 314 of the substrate 305. In use, in accordance with one embodiment, the interconnects 307 provide both an electrical and mechanical coupling between the bond pads 304 of the integrated circuit 302 and the landing pads 314 of the substrate 305.

To accomplish this, the interconnects 307 include metal projections 306 extending from the bond pads 304 of the integrated circuit 302. In various embodiments, the metal projections 306 may take the form of linear or tapered columns comprising any desired metallic material. Just by way of example, the metal projections 306 may comprise of a metal including, but not limited to copper, aluminum, gold, and/or silver. In one particular embodiment, the metal projections 306 may comprise of copper, for reasons that will be elaborated upon hereinafter in greater detail.

Still yet, the interconnects 307 further include a solder material 308 for connecting the metal projections 306 and the landing pads 314 of the substrate 305. The solder material 308 may comprise any desired material that services to provide an electrical and/or mechanical connection between the metal projections 306 and the landing pads 314 of the substrate 305.

By way of example only, such solder material 308 may include, but is not limited to lead, tin, indium, gallium, bismuth, cadmium, zinc, copper, gold, silver, antimony, and germanium. In still yet other embodiments, such solder material 308 may comprise a silver/lead/tin alloy, an eutectic tin/silver alloy, a metal-filled polymer, a copper-filled epoxy, and/or any other material, for that matter. In even still additional embodiments, the solder material 308 may even be lead-free, as an option.

Strictly as an option, the solder material 308 may, in some embodiments, be plated. In such embodiments, the solder material 308 may be plated with a metal including, but not limited copper, aluminum, gold, and/or silver. As yet another option, the solder material 308 may be plated with an immersion thin material, utilizing any desired processing technique (e.g. plasma immersion thin film deposition, etc.).

As yet another option, a polymide layer 311 may be deposited on the integrated circuit 302 between the metal projections 306. In one embodiment, such polymide layer 311 may extend ¾ a height of the metal projections 306. Of course, the polymide layer 311 may take any form. Further, the polymide layer 311 may further form a meniscus prior to the application of any remaining well known underfill material 312.

In use, the polymide layer 311 may serve to prevent sheering of the metal projections 306 in situations where the integrated circuit 302 exhibits any thermal expansion. Specifically, the thermal expansion of the integrated circuit 302 may differ from that of the metal projections 306 which may, in turn, result in the aforementioned sheering. In case of such thermal expansion, the polymide layer 311 may serve to absorb and accommodate such thermal expansion differential, thereby preventing such sheering and any resultant damage.

By this structure, the solder material 308 is capable of filling the aforementioned areas 315 between the mask 310 and the landing pads 314. Further, a bump pitch may, in some embodiments, be reduced as a result of the solder material 308 filling such areas 315. Specifically, by providing the areas 315 between the mask 310 and the landing pads 314 of the substrate 305, the solder material 308 may be less likely to bulge laterally (which would increase a resultant "bump diameter"), since such areas 315 provide additional space for the solder material 308 to collect and remain.

This potential bump pitch reduction may, in turn, provide more room between the interconnects 307 for other structures, etc. Just by way of example, additional I/O structures 316 may be positioned between the interconnects 307.

Figure 4A:
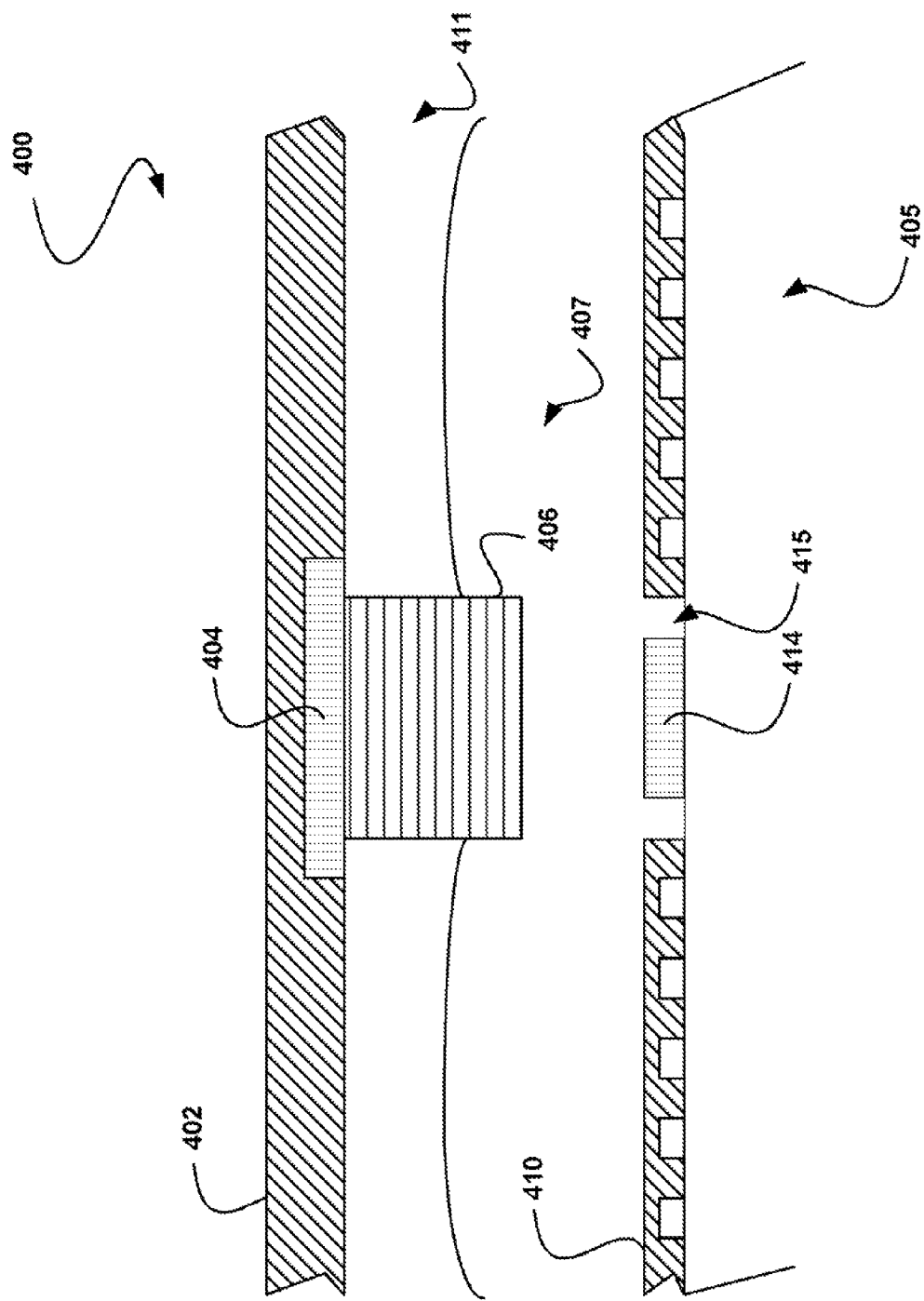
FIG. 4A shows an integrated circuit and a substrate prior to interconnection and application of solder material, in accordance with another embodiment.

More illustrative information will now be set forth regarding various optional architectures and functionality of different embodiments in which the foregoing apparatus 300 may or may not be implemented, per the desires of the user. For example, FIGS. 4A and 4R illustrate different stages of manufacture that may exist prior to the apparatus 300 taking the form shown in FIG. 3. It should be strongly noted that the following information is set forth for illustrative purposes and should not be construed as limiting in any manner. Any of the following features may be optionally incorporated with or without the other features described.

FIG. 4A shows an integrated circuit 402 and a substrate 405 prior to interconnection and application of solder material, in accordance with one embodiment. As an option, the configuration shown in FIG. 4A may represent one of various stages of manufacture prior to providing the apparatus 300 shown in FIG. 3. Of course, however, the configuration shown in FIG. 4A may exist in any context. Again, the aforementioned definitions may equally apply to the description below.

As shown, the integrated circuit 402 includes a plurality of bond pads 404, and the substrate 405 includes a plurality of landing pads 414 and a mask 410. Such mask 410 is shown to be spaced from the landing pads 414 for defining areas 415 therebetween. Further provided is a plurality of interconnects 407 including, at this stage in processing, only metal projections 406 extending from the bond pads 404 of the integrated circuit 402.

In one particular embodiment, the aforementioned metal projections 406 may comprise copper. In such exemplary embodiment, rigid sidewalls of the copper metal projections 406 may facilitate any underfilling of a gap between the integrated circuit 402 and the substrate 405 with a desired polymide layer 411, any other material (e.g. epoxy, etc.), etc. Still yet, such copper material may further provide enhanced thermal and/or electrical performance, and optionally increase a self-attenuation distance of alpha particles (thus offering soft-error protection).

In various exemplary embodiments, the aforementioned areas 415 may be provided by pattering the mask 410 utilizing a no solder mask define (NSMD) technique. Of course, in additional embodiments, other patterning techniques are contemplated. In the context of one exemplary patterning technique, the mask 410 may comprise a photoresist material. Further, the areas 415 may be provided by conducting a photo-exposure and developing the exposed photoresist layer to achieve the desired pattern.

As shown in FIG. 4A, such pattern may be configured to ensure that edges of the mask 410 are positioned in a manner, such that, when manufacture is complete, such edges remain at least substantially coincident/in-line with the side walls of the metal projections 406. Further, to provide room for the aforementioned areas 415, the landing pads 414 may include a lateral width that is less than a lateral width of the bond pads 404, and/or less than a diameter of the metal projections 406. Of course, such design parameters are set forth for illustrative purposes only and should not be construed as limiting in any manner.

Prior to being used to connect the integrated circuit 402 and the substrate 405, the interconnects 407 may be supplemented with solder material. More information regarding such stage of manufacture will be set forth in greater detail during reference to FIG. 4B.

Figure 4B:
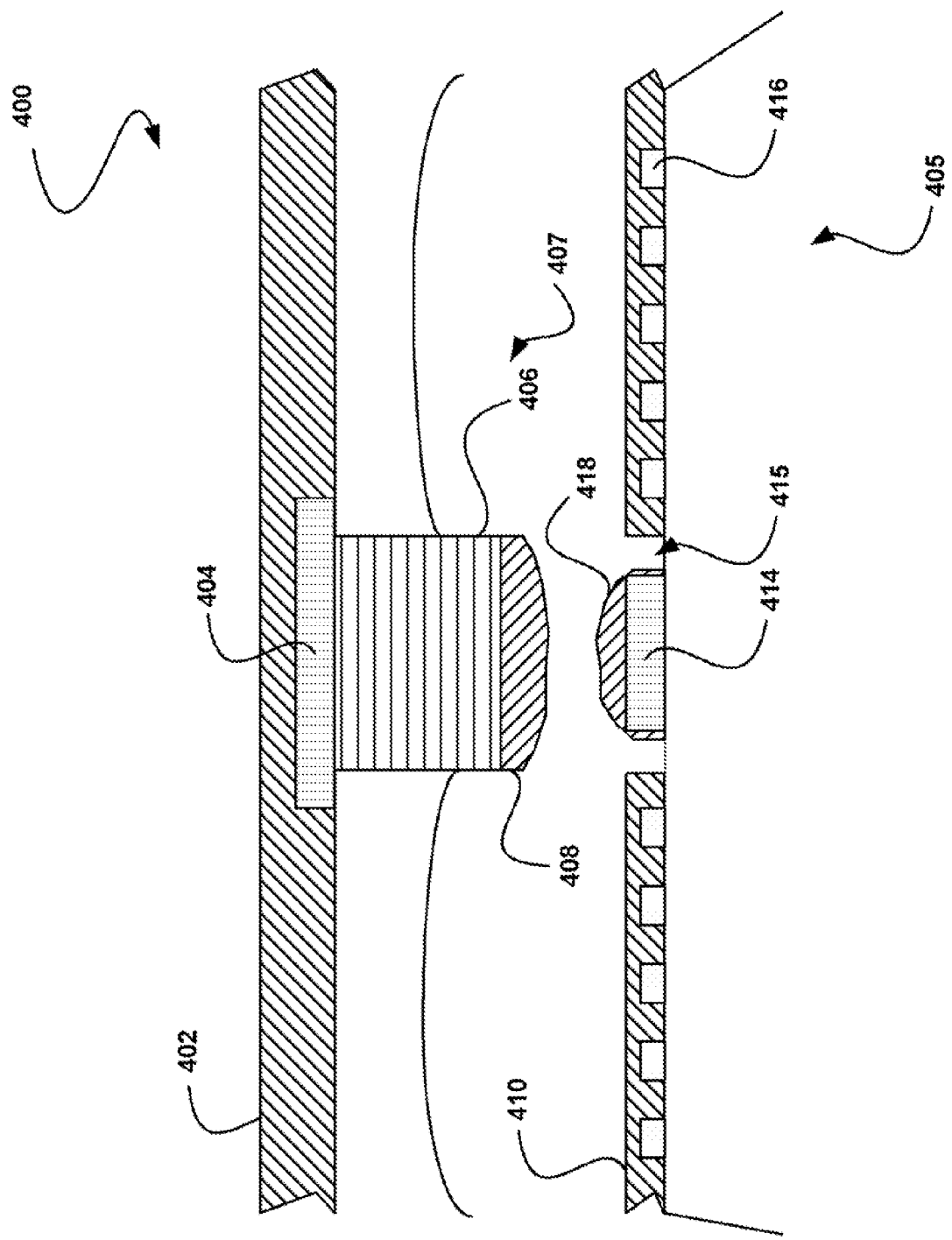
FIG. 4B shows the integrated circuit and the substrate of FIG. 4A prior to interconnection and after application of solder material, in accordance with another embodiment.

FIG. 4B shows the integrated circuit 402 and the substrate 405 of FIG. 4A prior to interconnection and after application of solder material, in accordance with one embodiment. Similar to the configuration shown in FIG. 4A, the configuration shown in FIG. 4B may represent one of various stages of manufacture prior to providing the apparatus 300 shown in FIG. 3. Of course, however, the configuration shown in FIG. 4B may exist in any context. Again, the aforementioned definitions may equally apply to the description below.

Similar to FIG. 4A, FIG. 48 illustrates the integrated circuit 402 as including the bond pads 404, and the substrate 405 as including the landing pads 414 and the mask 410. Again, such mask 410 is shown to be spaced from the landing pads 414 for defining areas 415 therebetween. Further provided is a plurality of interconnects 407 including metal projections 406.

While the final configuration (e.g. see, for example, FIG. 3, etc.) shows the solder material as being a component of the interconnects 407, it should be noted that such solder material may, in one embodiment, include first solder material 408 (e.g. a "tip solder," etc.) applied only to the metal projections 406, prior to interconnecting the integrated circuit 402 and the substrate 405. As an option, such first solder material 408 may be applied using a plating technique. One example of such plating involves applying a current to a wafer (of which the integrated circuit 402 is a component) and subsequently applying a bath of the plating material. To this end, the plating material adheres to the target which is, in this case, the first solder material 408.

Further, in another embodiment, such solder material may include second solder material 418 (e.g. a "pre-solder," etc.) applied only to the landing pads 414 of the substrate 405, prior to interconnecting the integrated circuit 402 and the substrate 405. As an option, the second solder material 418 may take the form of a printed solder material. In various embodiments, the second solder material 418 may or may not be applied to exposed sidewalls of the landing pads 414, in the manner shown. Of course, other embodiments are also contemplated where both the first solder material 408 and the second solder material 418 are applied using any desired application technique(s).

Further, as mentioned earlier, the first solder material 408 and/or the second solder material 418 may or may not be plated prior to reflow by the same or similar plating techniques discussed hereinabove with respect to application of the first solder material 408. This may, in some embodiments, help avoid oxidation of the solder material to facilitate the interconnection process. Still yet, the first solder material 408 and/or the second solder material 418 may or may not be lead-free, etc. In use, the first solder material 408 and/or the second solder material 418 may be subjected to a reflow treatment such that the solder material is at least partially melted to allow for the interconnection shown in FIG. 3.

By this structure, when the integrated circuit 402 and the substrate 405 are interconnected, the solder material 408 and/or 418 couples to an entirety of the top and side wall surfaces of the landing pads 414 of the substrate 405. Further, the areas 415 defined by the mask 410 are of sufficient size to accommodating such solder material 408 and/or 418, thereby reducing any bulging that may detrimentally require augmentation of bump pitch. In some embodiments, the aforementioned bulging may even be eliminated. To this end, the metal projections 406 not only help provide such desirable reduced bump pitch, but the solder material 408 and/or 418, at least to some extent, do not detract from such feature.

As mentioned earlier, the solder material 408 and/or 418 may thus be applied not only to a top surface of the landing pads 414 of the substrate 405, but to the side walls of the landing pads 414 as well. Thus, additional adhesion may potentially be afforded, since the solder material 408 and/or 418 connects with more surface area of the landing pads 414. This, in turn, may further allow a reduction in a size of the metal projections 407, and thus further contribute to the reduction of the bump pitch.

With such reduction in bump pitch, integrated circuits may be more effectively built with smaller die sizes (e.g. 90 um, 64 um, 45 um, etc.), while maintaining sufficient room for various I/O structures. See, for example, I/O structures 416 in FIG. 4B. In some embodiments, such bump pitch may be less than 150 um, 140 um, 130 um, and even less than 120 um, etc.

In one embodiment, the integrated circuit 402 and the substrate 405 may take the form of a flip chip. Of course, varying embodiments are also contemplated which may involve ceramic packaging, plastic grid arrays, ball grid arrays, etc.

Figure 5:
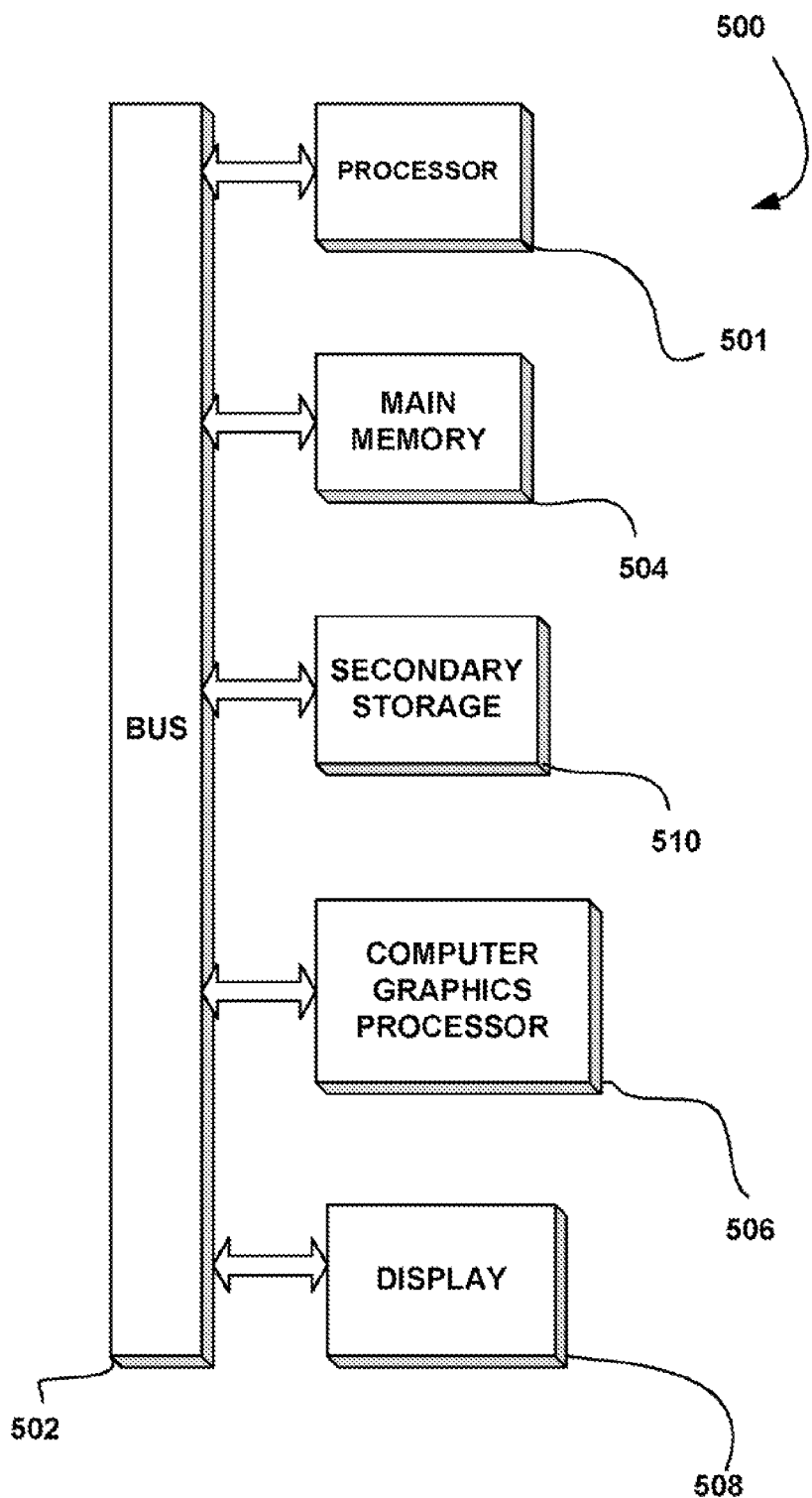
FIG. 5 illustrates various components of an exemplary system in which the integrated circuit of the various previous embodiments may be implemented.

FIG. 5 illustrates various components of an exemplary system 500 in which the integrated circuit of the various previous embodiments may be implemented. Specifically, in different exemplary embodiments, any of the components of the system 500 may include the integrated circuit/substrate, etc. of the previous embodiments.

As shown, a system 500 is provided including one or more processors, such as processor 501, which is connected to a communication bus 502. The system 500 also includes main memory 504. Control logic (software) and data are stored in the main memory 504 which may take the form of random access memory (RAM).

The system 500 also includes a graphics processor 506 and a display 508, i.e. a computer monitor. In one embodiment, the graphics processor 506 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional CPU and bus implementation. Of course, the various modules may also be situated separately or in various combinations of semiconductor platforms per the desires of the user.

The system 500 may also include a secondary storage 510. The secondary storage 510 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 504 and/or the secondary storage 510. Such computer programs, when executed, enable the system 500 to perform various functions. Memory 504 and storage 510 are thus examples of computer-readable media.

As mentioned earlier, the integrated circuit of the various previous figures may be implemented as the processor 501 (e.g. a CPU, etc.), the graphics processor 506, one or more chips of a chipset (i.e. a group of integrated circuits designed to work and sold as a unit for performing related functions, etc.), or any other integrated circuit for that matter.

Still yet, the integrated circuit of the various previous figures may be implemented in the context of a general computer system, a circuit board system, a game console system dedicated for entertainment purposes, an application-specific system, a mobile system, and/or any other desired system, for that matter. Just by way of example, the system may include a desktop computer, lap-top computer, hand-held computer, mobile phone, personal digital assistant (PDA), peripheral (e.g. printer, etc.), any component of a computer, and/or any other type of logic.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. An apparatus, comprising:
   an integrated circuit including a plurality of bond pads;
   a substrate including a plurality of landing pads and a mask that is spaced from the landing pads for defining areas therebetween; and
   a plurality of interconnects connected between the bond pads of the integrated circuit and the landing pads of the substrate, the interconnects including a plurality of metal projections extending from the bond pads of the integrated circuit, each of the metal projections having a diameter greater than a lateral width of each of the landing pads, and a solder material for connecting the metal projections and the landing pads of the substrate;
   wherein the solder material fills the areas;
   wherein a bump pitch is reduced as a result of the solder material filling the areas;
   wherein the landing pads are coplanar with respect to the mask;
   wherein a polymide layer is deposited between the integrated circuit and the substrate, and the polymide layer deposited between the integrated circuit and the substrate extends to 75% of a height of each of the metal projections.

2. The apparatus of claim 1, wherein the solder material is plated.

3. The apparatus of claim 2, wherein the solder material is plated with metal including at least one of copper, aluminum, gold, and silver.

4. The apparatus of claim 2, wherein the solder material is plated with an immersion thin material.

5. The apparatus of claim 2, wherein the plating to the solder material is applied by applying a current to the integrated circuit, and applying a bath of plating material to at least each of the metal projections.

6. The apparatus of claim 4, wherein the solder material is plated with the immersion thin material utilizing a plasma immersion thin film deposition.

7. The apparatus of claim 1, wherein the solder material comprises a material including at least one of lead, tin, indium, gallium, bismuth, cadmium, zinc, copper, gold, silver, antimony, and germanium.

8. The apparatus of claim 1, wherein the solder material comprises an alloy.

9. The apparatus of claim 8, wherein the solder material comprises a silver/lead/tin alloy.

10. The apparatus of claim 8, wherein the solider material comprises an eutectic tin/silver alloy.

11. The apparatus of claim 1, wherein the solder material comprises a metal-filled polymer.

12. The apparatus of claim 1, wherein the solder material comprises a copper-filled epoxy.

13. The apparatus of claim 1, wherein the solder material is lead-free.

14. The apparatus of claim 1, wherein the metal projections comprise of metal including at least one of copper, aluminum, gold, and silver.

15. The apparatus of claim 1, wherein the mask is patterned utilizing a no solder mask define (NSMD) technique.

16. The apparatus of claim 1, wherein the landing pads are bare on lead (BOL) landing pads.

17. The apparatus of claim 1, wherein reducing the bump pitch includes reducing a lateral bulge of the solder material, and the bump pitch is reduced as a result of the areas providing additional space for the solder material to collect and remain.

18. The apparatus of claim 1, wherein each of the metal projections is a tapered column.

19. The apparatus of claim 1, wherein the diameter of each of the metal projections is greater than the lateral width of each of the landing pads such that a lateral bulge of the solder material is prevented.

20. A system, comprising:
    a bus;
    a memory; and
    a processor in communication with the memory via the bus, the processor including an integrated circuit with a plurality of bond pads; a substrate with a plurality of landing pads and a mask that is spaced from the landing pads for defining areas therebetween; and a plurality of interconnects connected between the bond pads of the integrated circuit and the landing pads of the substrate, the interconnects including a plurality of metal projections extending from the bond pads of the integrated circuit, each of the metal projections having a diameter greater than a lateral width of each of the landing pads, and a solder material for connecting the metal projections and the landing pads of the substrate;
    wherein the solder material fills the areas;
    wherein a bump pitch is reduced as a result of the solder material filling the areas;
    wherein the landing pads are coplanar with respect to the mask;
    wherein a polymide layer is deposited between the integrated circuit and the substrate, and the polymide layer deposited between the integrated circuit and the substrate extends to 75% of a height of each of the metal projections.

21. The system as recited in claim 20, wherein the processor is in communication with a display via the bus.

* * * * *

UNITED STATES PATENT AND TRADEMARK OFFICE
CERTIFICATE OF CORRECTION

PATENT NO.       : 8,198,727 B1
APPLICATION NO.  : 11/611818
DATED            : June 12, 2012
INVENTOR(S)      : Singh et al.

It is certified that error appears in the above-identified patent and that said Letters Patent is hereby corrected as shown below:

In the claims:
  Claim 10, col. 7, line 48; please replace "solider" with --solder--;
  Claim 13, col. 8, line 3; please replace "solider" with --solder--.

Signed and Sealed this
Twelfth Day of March, 2013

Teresa Stanek Rea
*Acting Director of the United States Patent and Trademark Office*